United States Patent
Gibson et al.

(10) Patent No.: US 6,274,896 B1
(45) Date of Patent: Aug. 14, 2001

(54) DRIVE TRANSISTOR WITH FOLD GATE

(75) Inventors: Bruce David Gibson, Lexington; George Keith Parish, Winchester, both of KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 09/484,119

(22) Filed: Jan. 14, 2000

(51) Int. Cl.$^7$ ............... H01L 29/80; H01L 31/112; H01L 21/8236; H01L 21/336
(52) U.S. Cl. ............... 257/259; 257/401; 257/287; 438/277; 438/284; 347/59
(58) Field of Search ............... 257/206, 259, 257/287, 365, 366, 393, 394, 401; 438/167, 186, 277, 284, 286; 347/9, 12, 57, 59

(56) References Cited

U.S. PATENT DOCUMENTS

| | | |
|---|---|---|
| H842 | 11/1990 | Ochs . |
| 3,414,781 | 12/1968 | Dill . |
| 3,967,305 | 6/1976 | Zuleeg . |
| 4,142,197 | 2/1979 | Dingwall . |
| 4,462,041 | 7/1984 | Glenn . |
| 4,583,111 | 4/1986 | Early . |
| 4,590,327 | 5/1986 | Nath et al. . |
| 4,725,747 * | 2/1988 | Stein et al. ............... 327/389 |
| 4,994,891 | 2/1991 | Moyal . |
| 5,142,346 | 8/1992 | Hynecek . |
| 5,258,638 | 11/1993 | Elhatem et al. . |
| 5,412,239 | 5/1995 | Williams . |
| 5,753,942 | 5/1998 | Seok . |
| 5,955,763 * | 9/1999 | Lin ............... 257/355 |
| 6,002,156 * | 12/1999 | Lin ............... 257/356 |
| 6,102,528 * | 8/2000 | Burke et al. ............... 347/59 |
| 6,184,559 * | 2/2001 | Hayakawa et al. ............... 257/401 |

FOREIGN PATENT DOCUMENTS

| | | |
|---|---|---|
| 004243610-A1 * | 7/1993 | (DE) . |
| 3526470 | 3/1977 | (JP) . |
| 358147062 A | 9/1983 | (JP) . |
| 406005849-A * | 1/1994 | (JP) . |

* cited by examiner

*Primary Examiner*—Olik Chaudhuri
*Assistant Examiner*—Hoai Pham
(74) *Attorney, Agent, or Firm*—Luedeka, Neely & Graham

(57) ABSTRACT

A drive transistor for an ink jet print head includes a semiconductor substrate having a serpentine channel of a first type doping, the channel comprising substantially parallel first and second serpentine channel portions, the first and second serpentine channel portions defining an inner region disposed between the first and second serpentine channel portions and an outer region disposed outside the first and second serpentine channel portions. A drain of a second type doping which is disposed within the inner region. A source of a second type doping which is disposed within the outer region. The transistor has a serpentine gate that overlies the serpentine channel. An elongate drain conductor, which tapers from a wide drain conductor end to a narrow drain conductor end, at least partially overlies a portion of the drain and the serpentine channel. An elongate source conductor has two tapered source conductor portions that at least partially overly the source and the serpentine channel. The folder serpentine geometry of the channel and gate provides for a reduction in device on-resistance of about 40% compared to a conventional ink jet drive transistor.

9 Claims, 6 Drawing Sheets

(section I-I)

(section II-II)

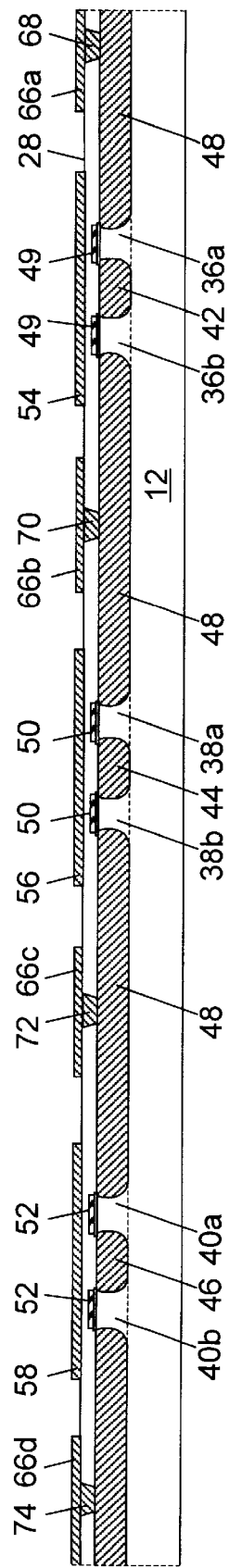
Fig. 6a (section III-III)
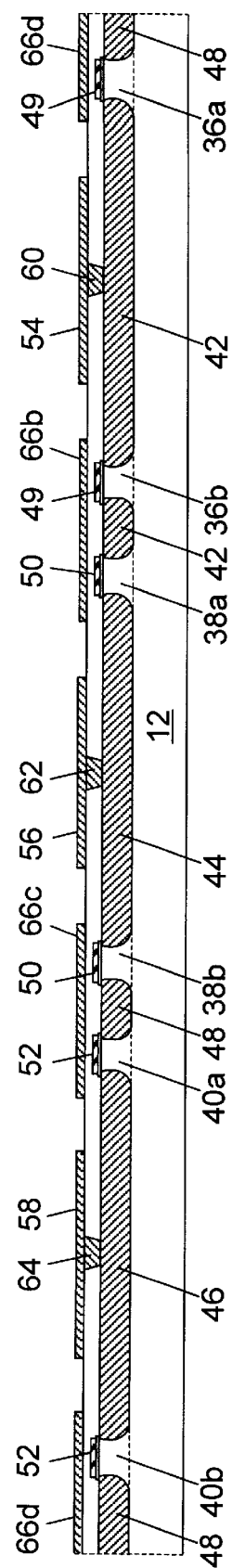
Fig. 6b (section IV-IV)

DRIVE TRANSISTOR WITH FOLD GATE

FIELD OF THE INVENTION

The present invention is generally directed to integrated circuits for ink jet print heads. More particularly, the present invention is directed to drive transistors for ink jet heating elements in an ink jet print head.

BACKGROUND OF THE INVENTION

Ink jet printers form images on paper by ejecting ink droplets from an array of nozzles on an ink jet print head. In thermal ink jet print heads, a heating element, such as a resistor, is associated with each nozzle. The heating element heats adjacent, thereby causing formation of a rapidly expanding bubble of ink. The expanding bubble causes a droplet of ink to be ejected from the nozzle.

Generally, each heating element is activated by a corresponding switching device, such as a MOSFET drive transistor, that is connected electrically in series with the heating element. Since these transistors must handle relatively high current levels, they also generate heat that is directly related to their on-resistance. The heat generated by the drive transistors can significantly affect the temperature of the print head chip, and can cause temperature gradients across the chip. Variations in print head temperature cause variations in ink droplet mass, which, in turn, degrade print quality. Therefore, it is desirable to keep the on-resistance of the drive transistors as low as possible.

As the state of the art advances, the spacing between nozzles in ink jet print heads decreases, thus allowing higher print resolution. As nozzle density increases, so does the density of heating elements and drive transistors associated with the nozzles. As the width of drive transistors decreases to accommodate high-density packaging, maintaining low on-resistance becomes much more challenging.

Therefore, a drive transistor that accommodates high-density packaging while maintaining low on-resistance and high-current carrying capability is needed.

SUMMARY OF THE INVENTION

The foregoing and other needs are met by a drive transistor for an ink jet print head that includes a semiconductor substrate having a serpentine channel of semiconductor material. The channel, which has a first type doping, includes first and second serpentine channel portions that are substantially parallel. The first and second serpentine channel portions define an inner region therebetween and an outer region disposed outside the first and second serpentine channel portions. The substrate also includes a drain made of semiconductor material having a second type doping. The drain is disposed within the inner region, and has drain fingers defined by the serpentine channel. The substrate further includes a source made of semiconductor material having the second type doping. The source is disposed within the outer region, and has source fingers defined by the serpentine channel. Due to the serpentine nature of the channel, the source fingers are inter-digitated with the drain fingers. The transistor also has a serpentine gate that substantially overlies the serpentine channel.

An elongate drain conductor, which tapers from a wide drain conductor end to a narrow drain conductor end, at least partially overlies a portion of the drain and the serpentine channel. Distributed along the drain conductor are drain conductor contacts for electrically connecting the drain conductor to the drain.

An elongate source conductor has two tapered source conductor portions that at least partially overly the source and the serpentine channel. The two source conductor portions have wide source conductor ends that are connected together and narrow source conductor ends that are spaced apart. One source conductor portion is disposed to one side of the drain conductor, and the other source conductor portion is disposed to the other side of the drain conductor. The wide source conductor ends are adjacent the narrow drain conductor end, and the narrow source conductor ends are adjacent the wide drain conductor end. Distributed along the source conductor are source conductor contacts for electrically connecting the source conductor to the source.

As explained in more detail hereinafter, the serpentine gate is continuous, thereby completely surrounding or "trapping" the drain. This "trapped drain" design significantly reduces leakage currents as compared to open-ended drain devices. This design also provides for stacking transistors closely together to accommodate a higher packaging density than was previously achieved in ink jet print head chips.

In another aspect, the invention provides a method for forming a drive transistor for an ink jet print head. The steps for forming the transistor include providing a semiconductor substrate having a first type doping. The substrate is doped to form a drain having a second type doping, where the drain has an outer perimeter at least partially defined by a serpentine channel having the first type doping. The channel comprises substantially parallel first and second serpentine channel portions, where the first and second serpentine channel portions define an inner region disposed between the first and second serpentine channel portions and an outer region disposed outside the first and second serpentine channel portions. The drain is formed such that it is disposed within the inner region and has drain fingers defined by the serpentine channel. The method includes doping the substrate in the outer region to form a source having the second type doping. The source is formed such that it has source fingers defined by the serpentine channel, where the source fingers are interdigitated with the drain fingers. A serpentine gate is formed which substantially overlies the serpentine channel. The method further includes forming an elongate drain conductor that at least partially overlies the drain and the serpentine channel. The drain conductor is formed to taper from a wide drain conductor end down to a narrow drain conductor end. According to the method, drain conductor contacts are formed which are distributed along the drain conductor for electrically connecting the drain conductor to the drain. An elongate source conductor is also formed which comprises two source conductor portions that at least partially overly the source and the serpentine channel. The two source conductor portions are tapered from wide source conductor ends that are connected together down to narrow source conductor ends that are spaced apart. The source conductor portions are formed such that one source conductor portion is disposed to one side of the drain conductor, and the other source conductor portion is disposed to the other side of the drain conductor, where the wide source conductor ends are adjacent the narrow drain conductor end, and the narrow source conductor ends are adjacent the wide drain conductor end. The method also includes forming source conductor contacts that are distributed along the source conductor for electrically connecting the source conductor to the source.

BRIEF DESCRIPTION OF THE DRAWINGS

Further advantages of the invention will become apparent by reference to the detailed description of preferred embodiwhich are not to scale, wherein like reference characters designate like or similar elements throughout the several drawings as follows:

FIG. 6a is a cross-sectional view of the transistor shown in FIG. 4 taken through section lines CC; and FIG. 6b is a cross sectional view of the transistor shown in FIG. 4 taken through section lines DD.

DETAILED DESCRIPTION OF THE INVENTION

Figure 1:
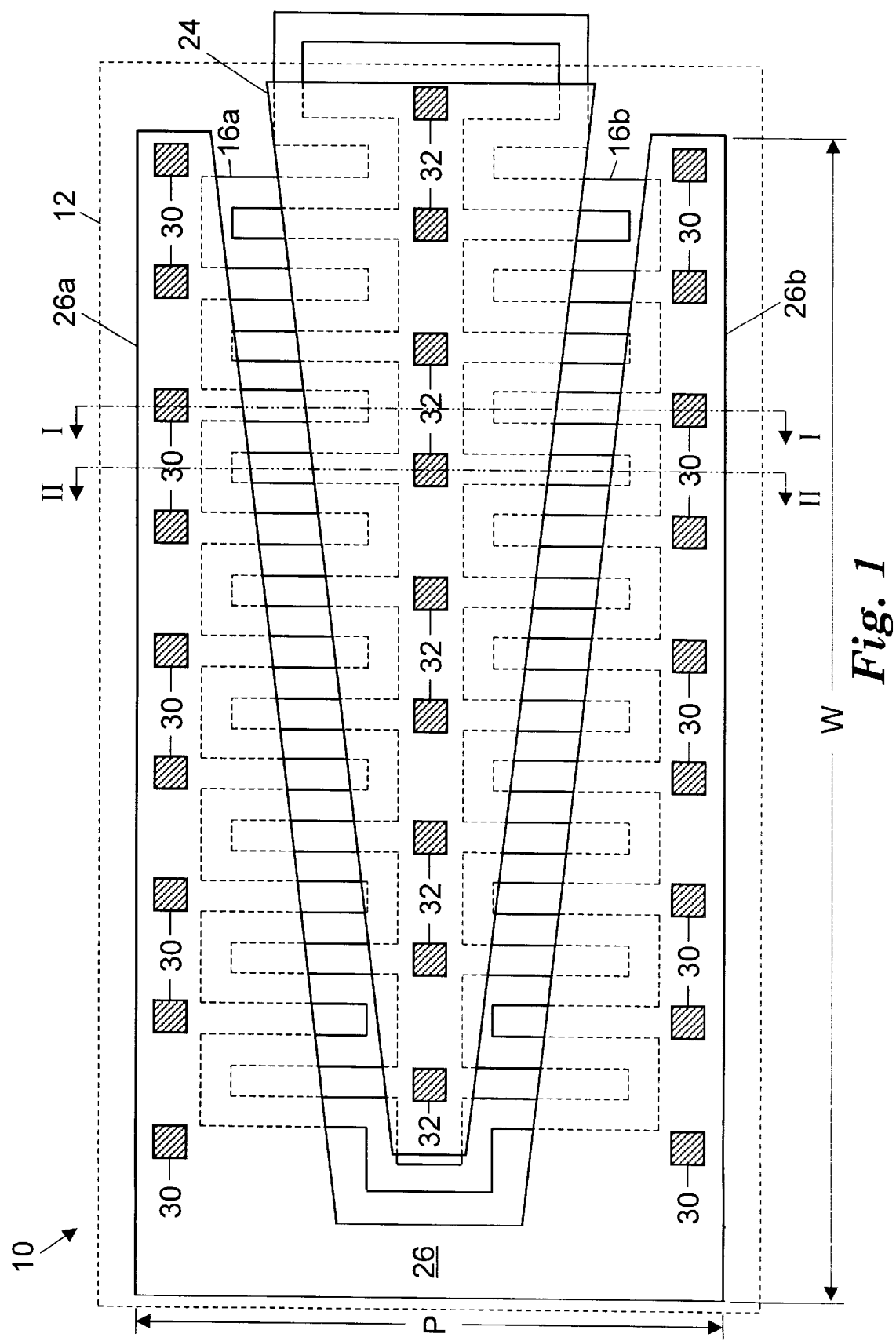
FIG. 1 depicts a top view of an ink jet drive transistor according to a preferred embodiment of the invention, including source and drain conductors.

FIGS. 1, 2 and 3a–b depict a drive transistor 10 for use as a switching device in an ink jet print head. The transistor 10 is preferably a metal-oxide semiconductor field-effect (MOSFET) device formed in a semiconductor substrate 12, such as silicon. As discussed in more detail below, the substrate 12 may contain many transistors 10, as well as other devices. For purposes of illustration, the bounds of the substrate 12 are represented in FIG. 1 by a dashed line. However, those skilled in the art will appreciate that the substrate 12 may extend in all directions beyond the area enclosed by the dashed line in FIG. 1. The substrate 12 has a first-type doping, which is p-type in the preferred embodiment of the invention.

Figure 3A:
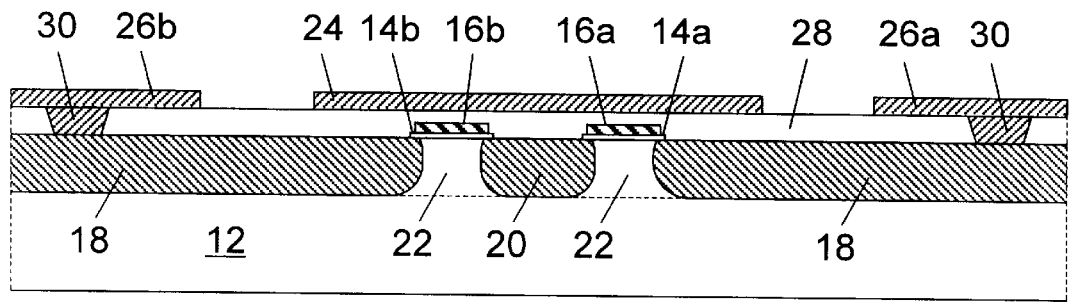
FIG. 3a is a first cross-sectional view of the ink jet drive transistor according to a preferred embodiment of the invention.
Figure 3B:
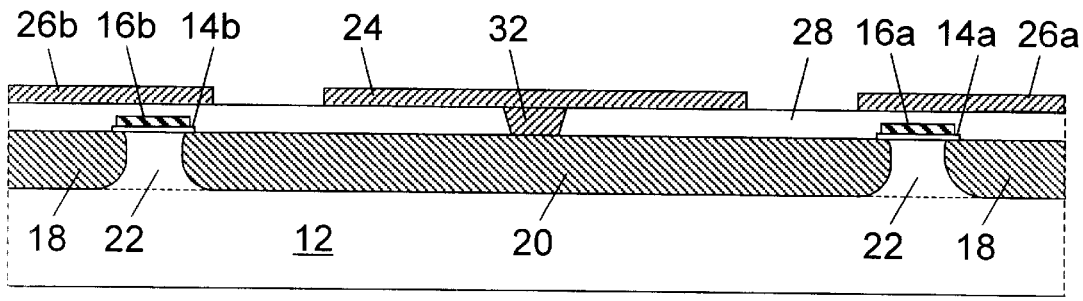
FIG. 3b is a second cross-sectional view of the ink jet drive transistor according to a preferred embodiment of the invention.

As shown in the cross-sectional views of FIGS. 3a–b, on top of the substrate 12 are first and second serpentine gate insulator portions 14a and 14b. Preferably, the gate insulator portions 14a and 14b are formed from an oxide, such as silicon dioxide. Gate portions 16a and 16b, preferably formed from polycrystalline silicon, substantially overlie the gate insulator portions 14a and 14b,respectively.

Figure 2:
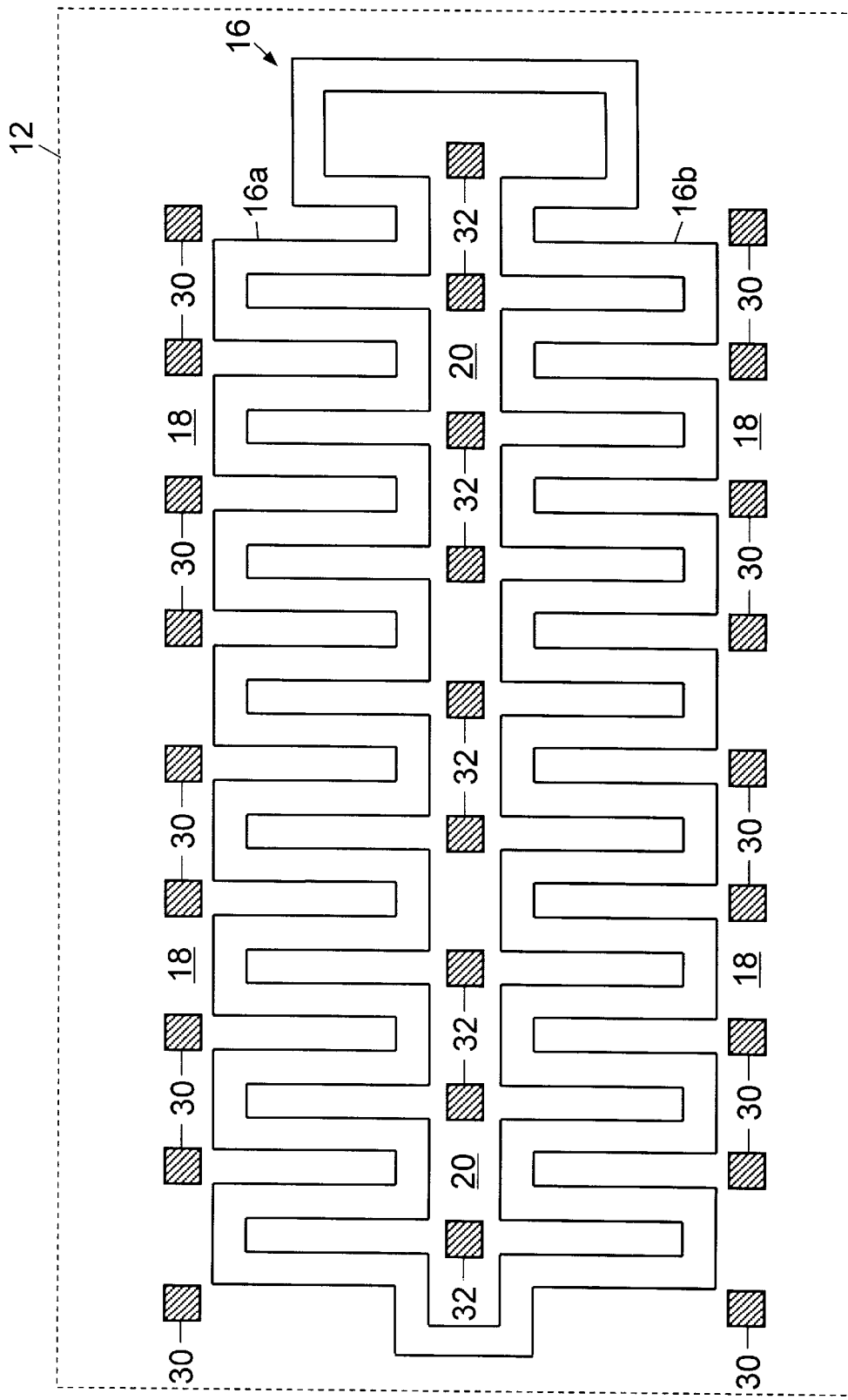
FIG. 2 depicts a top view of the ink jet drive transistor without the source and drain conductors.

FIG. 2 shows a top view of the gate portions 16a and 16b overlying the substrate 12. The gate portions 16a and 16b follow substantially parallel serpentine paths and are connected together at each end. Thus, the gate portions 16a and 16b together form a folded serpentine gate 16. Although not visible in FIG. 2, the gate insulator portions 14a and 14b are disposed directly beneath the gate portions 16a and 16b, respectively, and have substantially the same serpentine footprints as the gate portions 16a and 16b.

Regions of the substrate 12 not covered by the serpentine gate 16 are doped with a second-type doping, preferably n-type, using a doping process such as ion implantation, thus forming a source 18 and a drain 20. As shown in FIG. 2, the drain 20 lies within an inner region of the substrate which is the region between the first and second gate portions 16a and 16b. The source 18 lies within an outer region of the substrate which is outside the first and second gate portions 16a and 6b. As shown in FIGS. 3a and 3b, the n-type doping in the source 18 and the drain 20 leaves a serpentine channel 22 having p-type doping directly beneath the gate 16. As depicted in FIG. 2, the serpentine channel beneath the gate 16 defines fingers of the source 18 that are interdigitated with fingers of the drain 20.

As shown in FIGS. 1 and 3a–b, an elongate drain conductor 24 at least partially overlies the drain 20 and the serpentine channel 22. Preferably, the drain conductor 24 forms a trapezoid, having a wide end and a narrow end, with its width linearly tapered therebetween. An elongate source conductor 26 at least partially overlies the source 18 and the serpentine channel 22. The source conductor 26 includes two source conductor portions 26a and 26b, each of which are tapered, having wide ends that are connected together and narrow ends that are spaced apart. The source conductor portion 26a is disposed to one side of the drain conductor 24, and the source conductor portion 26b is disposed to the other side of the drain conductor 24. Preferably, the wide ends of the source conductor portions 26a and 26b are adjacent the narrow end of the drain conductor 24, and the narrow ends of the source conductor portions 26a and 26b are adjacent the wide end of the drain conductor 24. In a preferred embodiment of the invention, the drain and source conductors 24 and 26 are metal layers, such as aluminum.

As shown in FIGS. 3a and 3b, an insulative layer 28, such as a field oxide, lies between the conductors 24 and 26 and the gate 16, source 18, and drain 20. Referring to FIG. 3a, source contacts 30 extend through the insulative layer 28 to provide a conductive path between the source 18 and the source conductor portions 26a and 26b. As depicted in FIGS. 1 and 2, the source contacts 30 are distributed along the length of the source conductor portions 26a and 26b, with a source contact 30 substantially aligned with each one of the source fingers. As shown in FIG. 3b, drain contacts 32 extend through the insulative layer 28 to provide a conductive path between the drain 20 and the drain conductor 24. The drain contacts 32 are distributed along the length of the drain conductor 24, with a drain contact 32 substantially aligned with each one of the drain fingers.

A significant advantage of the present invention is provided by its trapped drain design. As shown in FIG. 2, the gate 16 is continuous, thereby completely surrounding the drain 20. Thus, the drain 20 is completely enclosed, or "trapped", by the gate 16. With this design, the parasitic diode path is completely to the gate 16, and there are no stray current paths as exist in a conventional "open-ended" drain design. Therefore, the present invention exhibits a lower leakage current than do open-ended drain devices.

Figure 4:
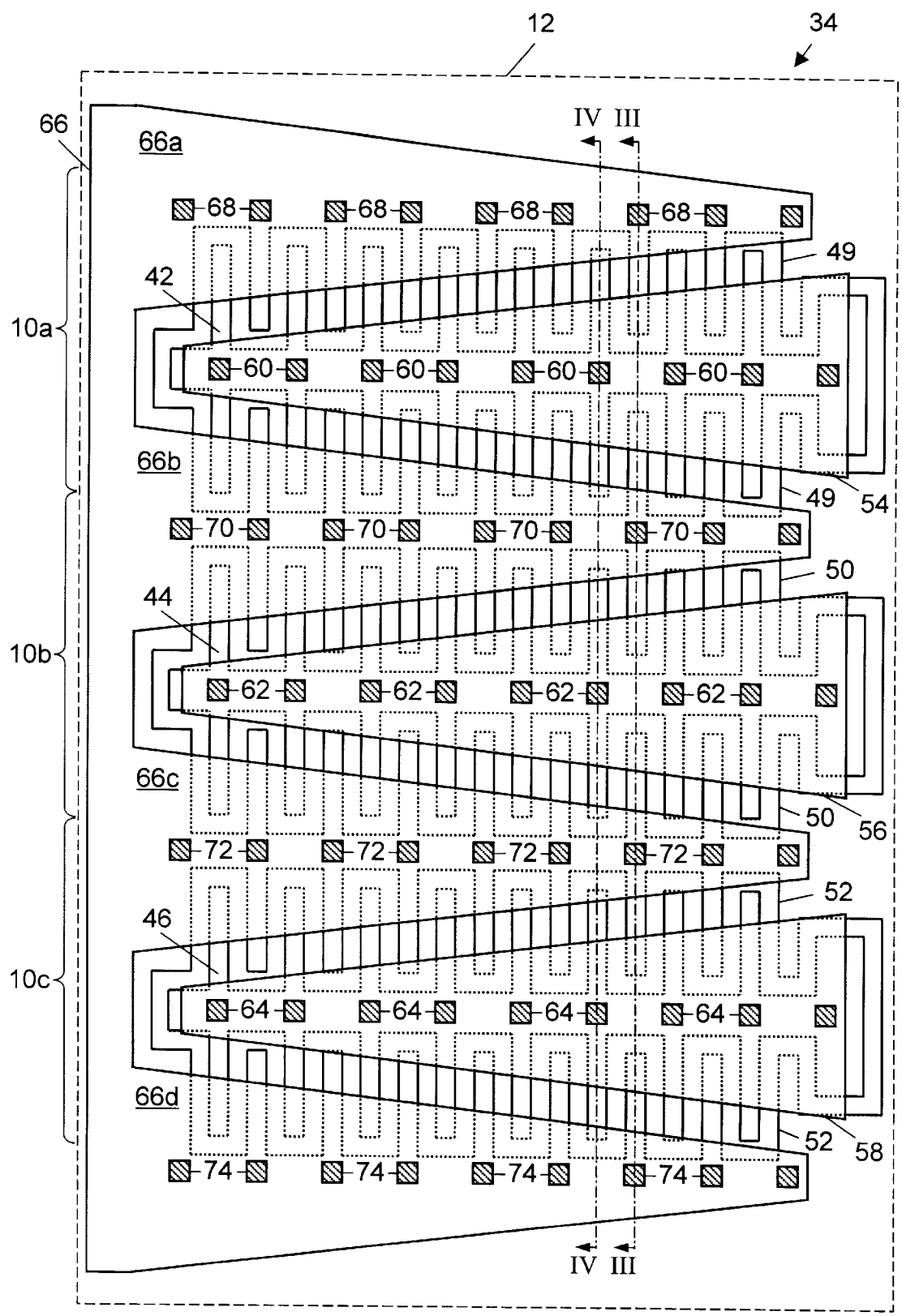
FIG. 4 depicts a multi-transistor drive circuit according to a preferred embodiment of the invention.
Figure 5:
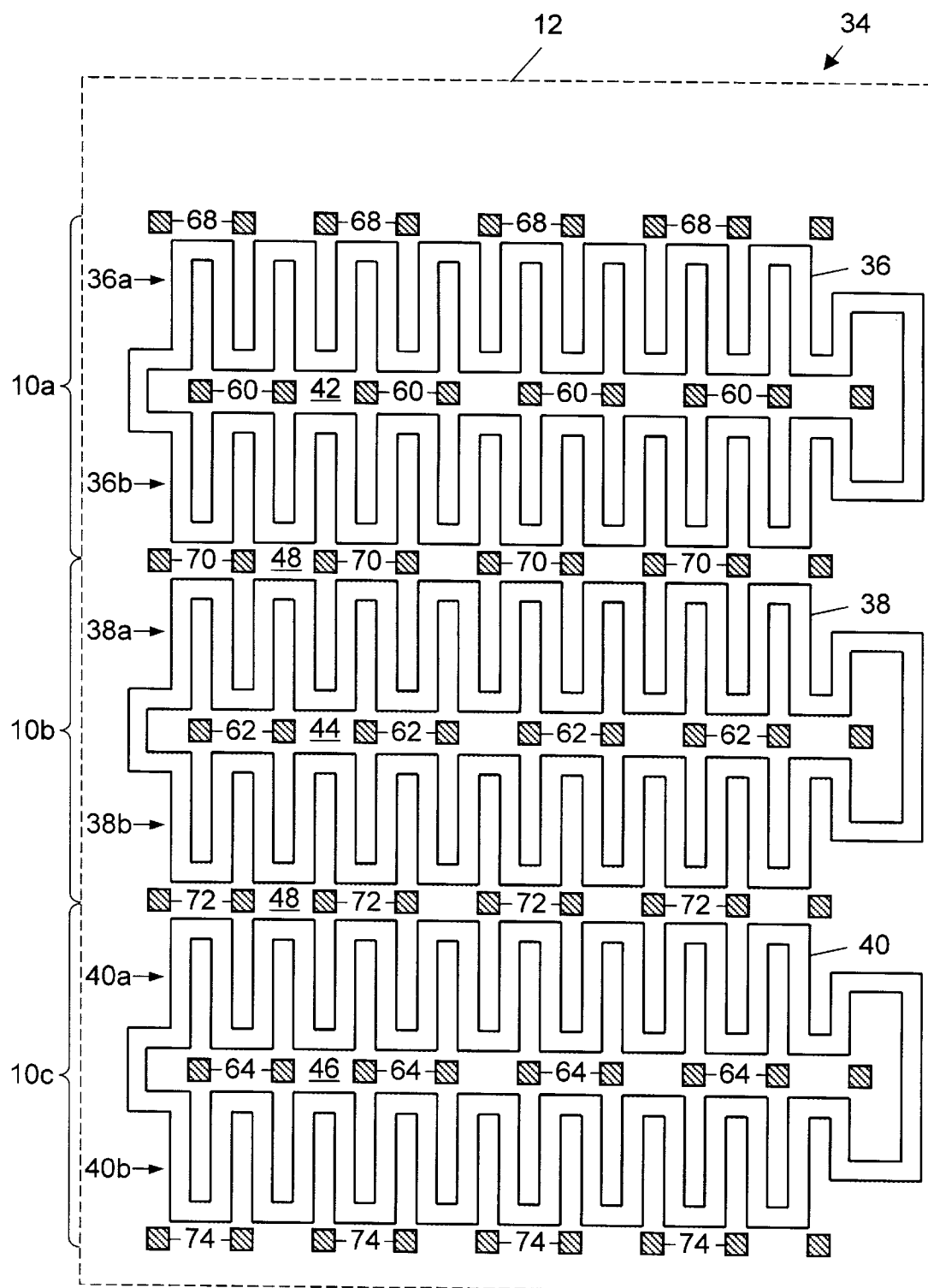
FIG. 5 is a view similar to the transistor shown in FIG. 4 with the source and drain contacts removed to more clearly show three serpentine channels.

To maximize device density on an ink jet print head chip, an alternate embodiment of the invention includes multiple transistors 10 combined to form a multi-transistor drive circuit 34, as shown in FIGS. 4, 5 and 6a–b. In this embodiment, the semiconductor substrate 12 includes first, second, and third serpentine channels 36, 38, and 40 which preferably have p-type doping. As shown in FIG. 5, the first serpentine channel 36 includes substantially parallel first and second serpentine channel portions 36a and 36b which define a first inner region disposed therebetween. The second serpentine channel 38 includes substantially parallel third and fourth serpentine channel portions 38a and 38b which define a second inner region disposed therebetween. The third serpentine channel 38 includes substantially parallel fifth and sixth serpentine channel portions 40a and 40b which define a third inner region disposed therebetween. The portion of the substrate 12 located outside the first, second, and third inner regions, and beyond the first, second, and third serpentine channels 36, 38, and 40 is referred to herein as the outer region.

Within the substrate 12 are a first drain 42, a second drain 44, and a third drain 46, each of which is preferably formed from semiconductor material having n-type doping. The first drain 42 is disposed within the first inner region, and has first drain fingers defined by the first serpentine channel 36. The second drain 44 is disposed within the second inner region, and has second drain fingers defined by the second serpentine channel 38. The third drain 46 is disposed within the third inner region, and has third drain fingers defined by the third serpentine channel 40.

A source 48, also composed of semiconductor material having the n-type doping, is disposed within the outer region. Fingers of the source 48 are defined by the first, second, and third serpentine channels 36, 38, and 40, and are interdigitated with the first, second, and third drain fingers.

As shown in FIGS. 4, 5, and 6a–b, a first serpentine gate 49 substantially overlies the first serpentine channel portions 36a and 36b, a second serpentine gate 50 substantially overlies the second serpentine channel portions 38a and 38b, and a third serpentine gate 52 substantially overlies the third serpentine channel portions 40a and 40b.

The preferred embodiment of the multi-transistor circuit 34 includes three trapezoidal drain conductors. A first drain conductor 54, having a wide first drain conductor end and a narrow first drain conductor end, partially overlies the first drain 42 and the first serpentine channel 36. A second drain conductor 56, having a wide second drain conductor end and a narrow second drain conductor end, partially overlies the second drain 44 and the second serpentine channel 38. A third drain conductor 58, having a wide third drain conductor end and a narrow third drain conductor end, partially overlies the third drain 46 and the third serpentine channel 40.

Distributed along the first drain conductor 54 are first drain conductor contacts 60 for electrically connecting the first drain conductor 54 to the first drain 42. Similarly, second drain conductor contacts 62 are distributed along the second drain conductor 56 to electrically connect the second drain conductor 56 to the second drain 44. Third drain conductor contacts 64 are distributed along the third drain conductor 58 to electrically connect the third drain conductor 58 to the third drain 46. As shown in FIG. 4, the first, second, and third drain conductor contacts 60, 62, and 64 are substantially aligned with corresponding drain fingers.

The preferred embodiment of the multi-transistor circuit 34 includes a single source conductor 66 consisting of first, second, third, and fourth source conductor portions 66a–d. As shown in FIGS. 4, 5, and 6a–b, the first source conductor portion 66a overlies the source 48 and the first serpentine channel portion 36a. Preferably, the first source conductor portion 66a is trapezoidal, having a wide end and a narrow end and being tapered therebetween.

The second source conductor portion 66b overlies the source 48, the second serpentine channel portion 36b, and the third serpentine channel portion 38a. The second source conductor portion 66b is also preferably trapezoidal, having a wide end and a narrow end. The wide end of the second source conductor portion 66b is connected to the wide end of the first source conductor portion 66a, and is located between the narrow end of the first drain conductor 54 and the narrow end of the second drain conductor 56.

The third source conductor portion 66c, which is connected to the second source conductor portion 66b, overlies the source 48, the fourth serpentine channel portion 38b, and the fifth serpentine channel portion 40a. Preferably, the third source conductor portion 66c is trapezoidal, having a wide end and a narrow end. The wide end of the third source conductor portion 66c is located between the narrow end of the second drain conductor 56 and the narrow end of the third drain conductor 58.

The fourth source conductor portion 66d overlies the source 48 and the sixth serpentine channel portion 40b. The fourth source conductor portion 66d is also trapezoidal, having a wide end and a narrow end. The wide end of the fourth source conductor portion 66d is connected to the wide end of the third source conductor portion 66c.

As shown in FIG. 4, the wide end of the first drain conductor 54 is disposed between the narrow end of the first source conductor portion 66a and the narrow end of the second source conductor portion 66b. The wide end of the second drain conductor 56 is disposed between the narrow end of the second source conductor portion 66b and the narrow end of the third source conductor portion 66c. The wide end of the third drain conductor 58 is disposed between the narrow end of the third source conductor portion 66c and the narrow end of the fourth source conductor portion 66d.

A set of first source conductor contacts 68 are distributed along the first source conductor portion 66a, with a first source conductor contact 68 being aligned with each of the first source fingers. The first source conductor contacts 68 electrically connect the first source conductor portion 66a to the source 48. Second source conductor contacts 70, each aligned with corresponding source fingers, electrically connect the second source conductor portion 66b to the source 48. Similarly, third source conductor contacts 72 and fourth source conductor contacts 74 electrically connect the third and fourth source conductor portions 66c and 66d, respectively, to the source 48.

As shown in FIGS. 4 and 5, the first, second, and third drains 42, 44, and 46 are all "trapped" within the first, second, and third gates 48, 50, and 52, respectively. Thus, this alternate embodiment of the invention provides the advantage of the low leakage current drain design for each of the transistors 10a–c within the circuit 34.

A further advantage of the embodiment of FIGS. 4, 5, and 6a–b is that adjacent transistors 10a–c within the multi-transistor circuit 34 share a common source 48 and common source contacts 70 and 72. For example, the transistor 10a shares the source 48 and the source contacts 70 with the transistor 10b and the transistor 10b shares the source 48 and the source contacts 72 with the transistor 10c. This sharing of source and source contacts allows significantly higher packing density of transistors on a print head chip than was previously achievable.

One skilled in the art will appreciate that the embodiment of the invention shown in FIGS. 4, 5, and 6a–b is not limited to a combination of three transistors 10a–c but may be extended to include many more transistors 10, such as would be the case on an ink jet print head chip.

It is contemplated, and will be apparent to those skilled in the art from the preceding description and the accompanying drawings that modifications and/or changes may be made in the embodiments of the invention. Accordingly, it is expressly intended that the foregoing description and the accompanying drawings are illustrative of preferred embodiments only, not limiting thereto, and that the true spirit and scope of the present invention be determined by reference to the appended claims.

What is claimed is:

1. A drive transistor for an ink jet print head comprising:
   a semiconductor substrate comprising:
      a serpentine channel of semiconductor material having a first type doping, the channel comprising substantially parallel first and second serpentine channel portions, the first and second serpentine channel portions defining an inner region disposed between the first and second serpentine channel portions and an outer region disposed outside the first and second serpentine channel portions;

a drain comprising semiconductor material having a second type doping disposed within the inner region, the drain having drain fingers defined by the serpentine channel;

a source comprising semiconductor material having the second type doping disposed within the outer region, the source having source fingers defined by the serpentine channel, the source fingers being interdigitated with the drain fingers;

a serpentine gate substantially overlying the serpentine channel;

an elongate drain conductor at least partially overlying the drain and the serpentine channel, the drain conductor having a wide drain conductor end and a narrow drain conductor end and being tapered therebetween;

drain conductor contacts distributed along the drain conductor for electrically connecting the drain conductor to the drain;

an elongate source conductor comprising two source conductor portions that at least partially overly the source and the serpentine channel, the two source conductor portions being tapered and having wide source conductor ends that are connected together and narrow source conductor ends that are spaced apart, one source conductor portion being disposed to one side of the drain conductor, and the other source conductor portion being disposed to the other side of the drain conductor, the wide source conductor ends being adjacent the narrow drain conductor end, and the narrow source conductor ends being adjacent the wide drain conductor end; and source conductor contacts distributed along the source conductor for electrically connecting the source conductor to the source.

2. The drive transistor of claim 1 wherein the serpentine gate is continuous, thereby completely surrounding the drain.

3. The drive transistor of claim 1 wherein the drain conductor forms a trapezoid, and sides of the source conductor portions on either side of the drain conductor are parallel with adjacent sides of the drain conductor.

4. The drive transistor of claim 3 wherein the source conductor portions form trapezoids.

5. The drive transistor of claim 1 wherein the serpentine gate is formed from polycrystalline silicon.

6. The drive transistor of claim 1 having a drain conductor contact aligned with each of the drain fingers and a source conductor contact aligned with each one of the source fingers.

7. A drive transistor for an ink jet print head comprising:
a semiconductor substrate comprising:
a serpentine channel of semiconductor material having a first type doping, the channel comprising substantially parallel first and second serpentine channel portions, the first and second serpentine channel portions defining an inner region disposed between the first and second serpentine channel portions and an outer region disposed outside the first and second serpentine channel portions;

a drain comprising semiconductor material having a second type doping disposed within the inner region, the drain having drain fingers defined by the serpentine channel;

a source comprising semiconductor material having the second type doping disposed within the outer region, the source having source fingers defined by the serpentine channel, the source fingers being interdigitated with the drain fingers;

a continuous serpentine gate of polycrystalline silicon which substantially overlies the serpentine channel and completely surrounds the drain;

an elongate trapezoidal drain conductor at least partially overlying the drain and the serpentine channel, the drain conductor having a wide drain conductor end and a narrow drain conductor end and being tapered therebetween, the drain conductor having sides that are parallel with adjacent sides of the source conductor portions on either side of the drain conductor;

drain conductor contacts distributed along the drain conductor for electrically connecting the drain conductor to the drain, each of the drain conductor contacts being aligned with a corresponding one of the drain fingers;

an elongate source conductor comprising two trapezoidal source conductor portions that at least partially overly the source and the serpentine channel, the two source conductor portions being tapered and having wide source conductor ends that are connected together and narrow source conductor ends that are spaced apart, one source conductor portion being disposed to one side of the drain conductor, and the other source conductor portion being disposed to the other side of the drain conductor, the wide source conductor ends being adjacent the narrow drain conductor end, and the narrow source conductor ends being adjacent the wide drain conductor end; and source conductor contacts distributed along the source conductor for electrically connecting the source conductor to the source, each of the source conductor contacts being aligned with a corresponding one of the source fingers.

8. A multi-transistor drive circuit for an ink jet print head comprising:
a semiconductor substrate comprising:
a first serpentine channel of semiconductor material having a first type doping, the first channel comprising substantially parallel first and second serpentine channel portions, the first and second serpentine channel portions defining a first inner region disposed between the first and second serpentine channel portions and an outer region disposed outside the first and second serpentine channel portions;

a second serpentine channel of semiconductor material having the first type doping, the second channel comprising substantially parallel third and fourth serpentine channel portions, the third and fourth serpentine channel portions defining a second inner region disposed between the third and fourth serpentine channel portions, wherein the outer region is disposed outside the third and fourth serpentine channel portions;

a first drain comprising semiconductor material having a second type doping disposed within the first inner region, the first drain having first drain fingers defined by the first serpentine channel;

a second drain comprising semiconductor material having the second type doping disposed within the second inner region, the second drain having second drain fingers defined by the second serpentine channel; and a source comprising semiconductor material having the second type doping disposed within the outer region, the source having source fingers defined by the first and second serpentine channels, the source fingers being inter-digitated with the first and second drain fingers;

a first serpentine gate substantially overlying the first serpentine channel;

a second serpentine gate substantially overlying the second serpentine channel;

a first elongate drain conductor at least partially overlying the first drain and the first serpentine channel, the first drain conductor having a wide first drain conductor end and a narrow first drain conductor end and being tapered therebetween;

a second elongate drain conductor at least partially overlying the second drain and the second serpentine channel, the second drain conductor having a wide second drain conductor end and a narrow second drain conductor end and being tapered therebetween;

first drain conductor contacts distributed along the first drain conductor for electrically connecting the first drain conductor to the first drain;

second drain conductor contacts distributed along the second drain conductor for electrically connecting the second drain conductor to the second drain;

a source conductor comprising:
- a first elongate source conductor portion at least partially overlying the source and the first serpentine channel portion, the first source conductor having a wide first source conductor end and a narrow first source conductor end and being tapered therebetween, the wide first source conductor end being disposed adjacent the narrow first drain conductor end;
- a second elongate source conductor portion at least partially overlying the source and the second and third serpentine channel portions, the second source conductor having a wide second source conductor end and a narrow second source conductor end and being tapered therebetween, the wide second source conductor end being connected to the wide first source conductor end and being disposed between the narrow first drain conductor end and the narrow second drain conductor end; and
- a third elongate source conductor portion at least partially overlying the source and the fourth serpentine channel portion, the third source conductor having a wide third source conductor end and a narrow third source conductor end and being tapered therebetween, the wide third source conductor end being connected to the wide second source conductor end and being disposed adjacent the narrow second drain conductor end;

the first wide drain conductor end being disposed between the narrow first source conductor end and the narrow second source conductor end;

the second wide drain conductor end being disposed between the narrow second source conductor end and the narrow third source conductor end;

first source conductor contacts distributed along the first source conductor portion for electrically connecting the first source conductor portion to the source;

second source conductor contacts distributed along the second source conductor portion for electrically connecting the second source conductor portion to the source; and third source conductor contacts distributed along the third source conductor portion for electrically connecting the third source conductor portion to the source.

9. A method for manufacturing a drive transistor for an ink jet print head comprising:

providing a semiconductor substrate having a first type doping;

doping the substrate to form a drain having a second type doping, the drain having an outer perimeter at least partially defined by a serpentine channel having the first type doping, the channel comprising substantially parallel first and second serpentine channel portions, the first and second serpentine channel portions defining an inner region disposed between the first and second serpentine channel portions and an outer region disposed outside the first and second serpentine channel portions, the drain disposed within the inner region and having drain fingers defined by the serpentine channel;

doping the substrate in the outer region to form a source having the second type doping, the source having source fingers defined by the serpentine channel, the source fingers being interdigitated with the drain fingers;

forming a serpentine gate substantially overlying the serpentine channel;

forming an elongate drain conductor at least partially overlying the drain and the serpentine channel, the drain conductor having a wide drain conductor end and a narrow drain conductor end and being tapered therebetween;

forming drain conductor contacts distributed along the drain conductor for electrically connecting the drain conductor to the drain;

forming an elongate source conductor comprising two source conductor portions that at least partially overly the source and the serpentine channel, the two source conductor portions being tapered and having wide source conductor ends that are connected together and narrow source conductor ends that are spaced apart, one source conductor portion being disposed to one side of the drain conductor, and the other source conductor portion being disposed to the other side of the drain conductor, the wide source conductor ends being adjacent the narrow drain conductor end, and the narrow source conductor ends being adjacent the wide drain conductor end; and forming source conductor contacts distributed along the source conductor for electrically connecting the source conductor to the source.

* * * * *